United States Patent
Krogh et al.

(10) Patent No.: US 6,933,659 B2
(45) Date of Patent: Aug. 23, 2005

(54) FIBER-REINFORCED MICROACTUATOR

(75) Inventors: Magnus Krogh, Linköping (SE); Olle Inganäs, Linköping (SE); Edwin Jager, Linköping (SE)

(73) Assignee: Micromuscle AG (SE)

( * ) Notice: Subject to any disclaimer, the term of this patent is extended or adjusted under 35 U.S.C. 154(b) by 0 days.

(21) Appl. No.: 10/494,587

(22) PCT Filed: Nov. 6, 2002

(86) PCT No.: PCT/EP02/12481

§ 371 (c)(1),
(2), (4) Date: May 5, 2004

(87) PCT Pub. No.: WO03/039859

PCT Pub. Date: May 15, 2003

(65) Prior Publication Data

US 2004/0251794 A1 Dec. 16, 2004

(30) Foreign Application Priority Data

Nov. 7, 2001  (SE) ............................................... 0103654

(51) Int. Cl.⁷ .............................................. H01L 41/08
(52) U.S. Cl. ...................... 310/330; 310/800; 310/345
(58) Field of Search .................... 310/330–332, 310/345, 366, 800

(56) References Cited

U.S. PATENT DOCUMENTS

| | | | | |
|---|---|---|---|---|
| 4,784,915 A | * | 11/1988 | Sakagami et al. | 310/800 |
| 6,548,939 B2 | * | 4/2003 | Riedel | 310/330 |
| 6,622,367 B1 | * | 9/2003 | Bolduc et al. | 29/447 |
| 6,803,700 B2 | * | 10/2004 | Maushard et al. | 310/330 |
| 2004/0103516 A1 | * | 6/2004 | Bolduc et al. | 29/446 |

FOREIGN PATENT DOCUMENTS

| | | |
|---|---|---|
| DE | 40 25 435 A1 | 12/1990 |
| DE | 196 20 826 A1 | 11/1997 |
| DE | 199 20 576 C1 | 6/2000 |
| DE | 100 13 821 A1 | 9/2001 |
| WO | WO-00/78222 A1 | 12/2000 |

OTHER PUBLICATIONS

Smela et al., "Controlled Folding of Micrometer–Size Structures", Science, vol. 268, Jun. 23, 1995.

* cited by examiner

Primary Examiner—Thomas M. Dougherty
(74) Attorney, Agent, or Firm—Lerner, David, Littenberg, Krumholz & Mentlik, LLP

(57) ABSTRACT

Microactuator comprising a volume changing layer (1) and a carrier substrate layer (2) carrying the volume changing layer (1), the microactuator also comprising a reinforcing structure (3) having an unevenly distributed bending stiffness and that the reinforcing structure (3) is spread over any of the layers (1), (2) to control the movement of the microactuator.

14 Claims, 4 Drawing Sheets

FIBER-REINFORCED MICROACTUATOR

CROSS-REFERENCE TO RELATED APPLICATIONS

The present application is a national phase entry under 35 U.S.C. § 371 of International Application No. PCT/EP02/12481, filed Nov. 6, 2002, published in English, which claims priority from Swedish patent Application No. 0103654-0, filed Nov. 7, 2001, all of which are incorporated herein by reference.

TECHNICAL FIELD

The invention relates to a microactuator comprising a volume changing layer and a carrier substrate layer.

BACKGROUND

Microactuators are devices that can exert a force or execute a movement upon external stimulation. Some are made of a bi-layer of a conducting polymer and a carrier substrate of e.g. metal or a polymer. These devices can have lateral dimensions ranging from micrometers to centimeters and layer thickness in the range of nanometers to millimeters.

When such a microactuator is subjected to an electrical current this causes a relative volume change between the layers. This relative volume change between the layers will lead to a bending movement of the microactuator. Forces stemming from the material with the largest volume change being connected to a material with a smaller volume change cause the bending movement.

The function of such microactuators is disclosed for instance in E. Smela, O. Inganäs, I. Lundström "Controlled Folding of Micrometer-Size Structures", Science, Vol. 268, p. 1735–1738.

The development of microactuators has opened up a wide variety of possible new applications, e.g. in electronics and in minimal invasive surgery.

The bending movement achieved with the above-described construction has been shown to be difficult to control. Therefore, there is a need for a construction, which gives better control of movement.

SUMMARY OF THE INVENTION

It is therefore an object of the invention to solve the above-described problem with control of movement.

This problem is solved in accordance with the invention by constructing the microactuator so that it comprises a reinforcing structure having an unevenly distributed bending stiffness and so that the reinforcing structure is spread over any of the layers. The spreading of the reinforcing structure over any of the layers includes placing the structure inside any of the layers as well as arranging it on top of any of the layers.

Microactuators in the sense of the invention are laminated constructions with two significantly larger dimensions, X and Y where the X-dimension is the width and the Y-dimension is the length of the microactuator, and a significantly smaller dimension Z, the thickness of the microactuator. The reinforcing structure is spread in the X-Y-dimensions.

The term microactuator includes constructions having dimensions in the centimeter scale and downwards. For instance may a microactuator according to the invention have X- and/or Y-dimensions in the centimeter to micrometer scale and a Z-dimension or thickness in the millimeter to nanometer scale.

A layer with smaller relative volume change will hereinafter be referred to as a carrier substrate layer, and material with a larger relative volume change will be referred to as a volume changing layer.

A volume changing layer in accordance with the invention refers to a material, which produces a relative difference in volume change compared to the carrier substrate material. Without the relative volume change, the microactuator would not work in the desired manner. Examples of materials that can act as a carrier substrate layer and as volume changing layer will be described.

In the examples given below, the volume change is electrochemically driven; the stimulus is an applied potential. However, in accordance with the invention, the volume change can also be caused by other chemical or physical principles than electrochemical, such as thermal expansion or solvent induced swelling, using other stimuli than potential.

The volume changing layer may comprise a conducting polymer, e. g. including pyrrole, aniline, thiophene, paraphenylene, vinylene, and phenylene polymers and copolymers, including substituted forms of the different monomers.

According to the invention, the reinforcing structure can be arranged in different ways in the microactuator. Preferably the reinforcing structure is arranged as elongated elements that have their longest dimension arranged in the crosswise, or transverse, direction of movement of the microactuator. For instance, the elongated elements can be beam-shaped or rod shaped. That is, the cross-section of the elongated element is square or circular. The reinforcing structure can also be in the form of an oriented film. An oriented film has a bending stiffness that is different in different lateral directions of the film. It is thus the orientated nature of the film that constitutes the reinforcing structures.

According to some embodiments of the invention, the reinforcing structure can be arranged partly or completely within any of the mentioned layers or outside these layers. The reinforcing structure can also be completely enclosed by, or confined within, any of the mentioned layers. That is, so that the reinforcing structure is only in contact with the layer that it is arranged within. The reinforcing structure can also be arranged between two of the layers that are laminated together, thus enclosing the reinforcing layer. In the case that the reinforcing structure is made of a separate material from that of the volume changing layer and the carrier substrate layer, the reinforcing structure may comprise a cross-linked polymer material, e.g. an epoxy or a polurethane polymer or a copolymer or a substituted polymer thereof. The reinforcing structure may also comprise a metal, such as gold, platinum, titanium, stainless steel or an alloy such as a alloy of nickel and titanium: nitinol. (In T. Duerig, A. Pelton, D. Stöckel, "An overview of nitinol medical applications", Materials Science and Engineering A 273–275 (1999) 149–160, the mechanical properties of nitinol is described).

According to further embodiments of the invention, the reinforcing structure can be made from the same material as the carrier substrate layer. The reinforcing effect can in this embodiment of the invention be achieved by having different thickness of the material in different parts of the substrate. Another way of achieving the object according to the invention is to corrugate the carrier substrate layer differently in different parts or in other ways change the bending stiffness properties so that it varies over that layer.

In the embodiment where the reinforcing structure is made from a separate material, it is made from a piece of material separate from both the volume changing layer and the carrier substrate layer.

In the embodiment where the reinforcing structure is made from a separate material and arranged as a layer, the varied bending stiffness can be achieved in the same manner as described above relating to the carrier substrate, i.e. the reinforcing structure is created by supplying a layer with varying thickness or in other ways arranging the layer so that the bending stiffness differs over the layer.

It is also possible within the realm of the invention to combine the different embodiments so that it comprises a second reinforcing structure. For instance, a first reinforcing structure arranged as a separate layer and a second reinforcing structure that is arranged in the volume changing layer or the carrier substrate layer. According to the invention the microactuator can also comprise several reinforcing structures.

DETAILED DESCRIPTION OF THE INVENTION

In the following description, an electrically stimulated microactuator is described. The invention is however not limited to electrically stimulated microactuators.

Although not mentioned in these examples, the microactuator could be made of more than two layers.

Figure 1A:
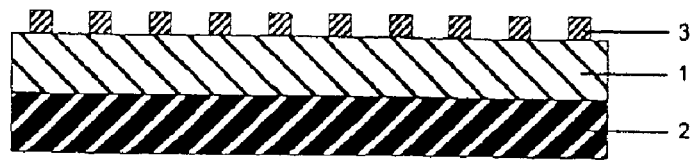
FIG. 1a–b schematically shows the cross-section of a microactuator according to one embodiment of the invention.
Figure 1B:
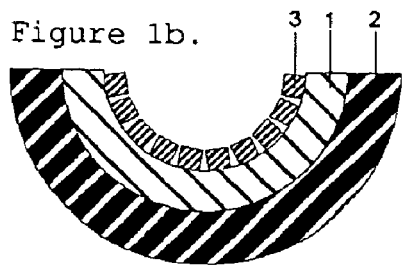

FIG. 1 discloses one embodiment of the invention. FIG. 1a–b shows a cross-section of the microactuator. The microactuator comprises a volume changing material arranged in layer 1. This volume changing material could be a conducting polymer, e. g. polypyrrole, polyaniline, or polythiophene. The volume changing layer 1 is laminated to a carrier substrate layer 2. The carrier substrate layer 2 can be made of a metal or a polymer. Arranged on one side of the volume changing layer 1 is a reinforcing structure 3. The reinforcing structure can be made of for instance a polymer such as epoxy or polyurethane, or a metal such as gold. The examples of materials given for the different components of the microactuator apply to all embodiments. The reinforcing structure according to this embodiment is in the form of beam shaped elements arranged transversally in relation to the direction of movement of the microactuator.

FIG. 1a shows the microactuator in a condition when a voltage is applied. A normal voltage applied is usually around −1 V for polypyrrole.

When the voltage is removed, the volume changing layer 1 contracts and the microactuator bends. Due to the reinforcing structure 3 the bending will be controlled and in a predetermined direction.

Further embodiments shown in FIGS. 2–6 also show the microactuator in a condition when the voltage is applied (in Figures a) and when the voltage is not applied (in Figures b) as described above for FIG. 1 for electrically activated materials. The further figures will therefore only be described regarding their construction.

Figure 2A:
FIG. 2a–b schematically shows the cross-section of a microactuator according to a second embodiment of the invention.
Figure 2B:
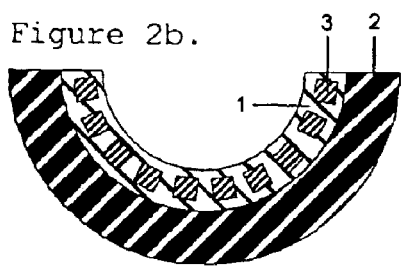

FIGS. 2a–b show a microactuator according to a second embodiment of the invention. The microactuator comprises a volume changing layer 1, a carrier substrate layer 2 and a reinforcing structure 3. The reinforcing structure 3 is confined within the volume changing layer 1 and not in contact with the carrier substrate 2. The reinforcing structure 3 here is in the form of beam shaped elements.

Figure 3A:
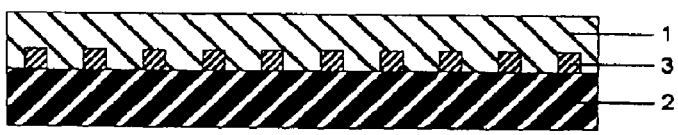
FIG. 3a–b schematically shows the cross-section of a microactuator according to a third embodiment of the invention.
Figure 3B:
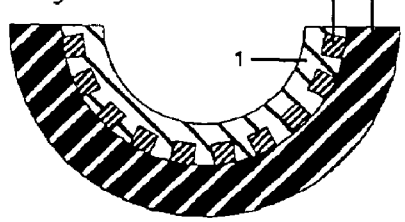

FIGS. 3a–b show a third embodiment of the invention. The microactuator according to this embodiment comprises a volume changing layer 1, a carrier substrate layer 2 and a reinforcing structure 3. The reinforcing structure 3 is arranged between the volume changing layer 1 and the carrier substrate layer 2. The reinforcing structure 3 here is in the form of beam shaped elements.

Figure 4A:
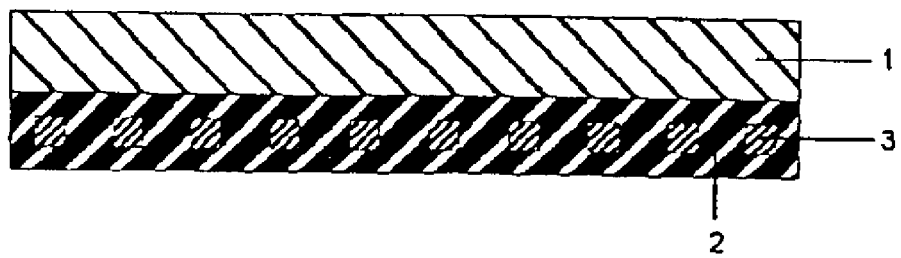
FIG. 4a–b schematically shows the cross-section of a microactuator according to a fourth embodiment of the invention.
Figure 4B:
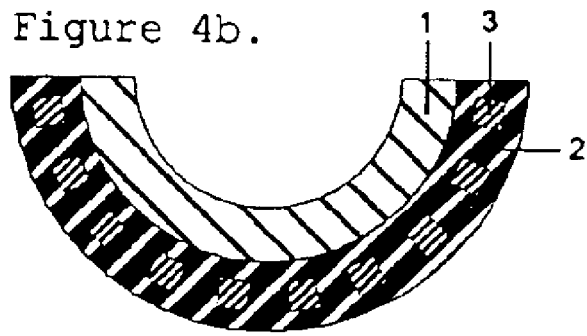

FIGS. 4a–b show a fourth embodiment of the invention. The microactuator according to this embodiment comprises a volume changing layer 1, a carrier substrate layer 2 and a reinforcing structure 3. The reinforcing structure 3 is confined within the carrier substrate layer 2 and not in contact with the volume changing layer 1. The reinforcing structure 3 is in the form of beam shaped elements.

Figure 5A:
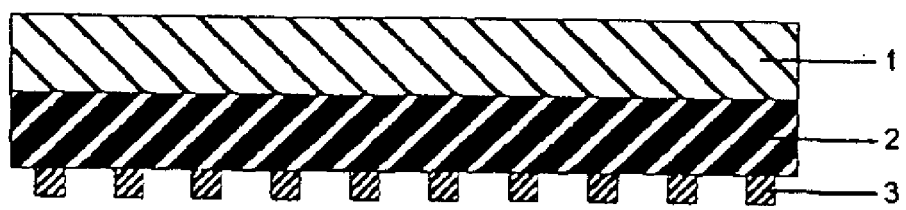
FIG. 5a–b schematically shows the cross-section of a microactuator according to a fifth embodiment of the invention.
Figure 5B:
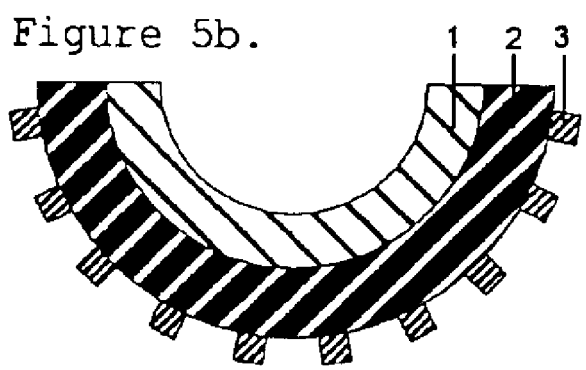

FIGS. 5a–b show a fifth embodiment of the invention. The microactuator according to this embodiment comprises a volume changing layer 1, a carrier substrate 2 and a reinforcing structure 3. The reinforcing structure 3 arranged outside the carrier substrate layer 2 and not in contact with the volume changing layer 1. The reinforcing structure 3 is in the form of beam shaped elements.

Figure 6A:
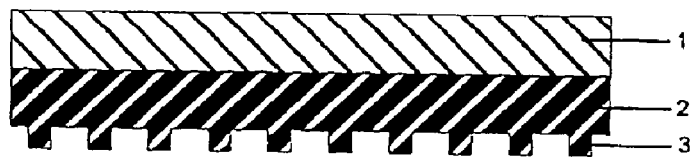
FIG. 6a–b schematically shows the cross-section of a microactuator according to a sixth embodiment of the invention.
Figure 6B:
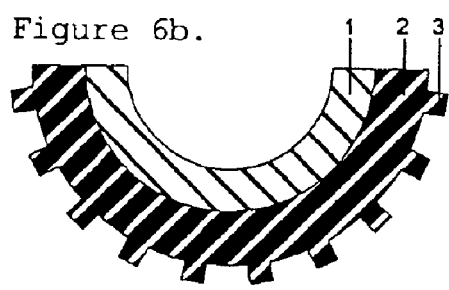

FIGS. 6a–b show a microactuator according to a sixth embodiment of the invention. The microactuator comprises a volume changing layer 1 and a carrier substrate layer 2. A reinforcing structure 3 is arranged by constructing the carrier substrate 2 so that it has varying thickness in different parts of the substrate. The reinforcing structure 3 is thus not made of a separate piece of material in this embodiment.

FIGS. 7–9 schematically show groups of microactuators from a top view. In figures a, the microactuators are shown from the top side in an expanded state when a voltage is applied. The black areas mark the volume changing layer 1, the top side of the bending areas, that is the areas over which the microactuators will bend. The white areas show the arrangement of the reinforcing structure 3. As an example the microactuators are formed as elongated rectangles, with a volume changing material 1 and reinforcement structure 3 on top of the carrier substrate 2 (not shown in FIG. a), constructed as shown in FIG. 1a–b. FIG. b show the microactuators when the voltage is removed and the microactuators are in a contracted state. The grey areas show the bottom side of the carrier substrate layer 2, that is the side of the microactuator where it bends away from. The arrangement of the reinforcing structure determines the movement. The volume changing material 1 will bend around the longitudinal axis of the respective elements making up the reinforcing structure 3.

Figure 7A:
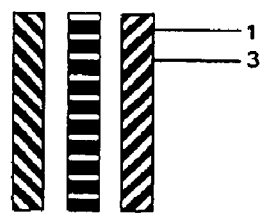
FIG. 7a–b shows a microactuator according to an embodiment of the invention seen from the top in an expanded state and in a contracted state.
Figure 7B:

FIG. 7a–b shows three microactuators arranged in parallel according to an embodiment of the invention. The configuration of the reinforcing structure 3 shown in FIG. 7a will lead to the bending pattern in FIG. 7b. In FIG. 7a can be seen that, in the center microactuator, the longitudinal axis of reinforcing elements have been arranged perpendicular in relation to the longitudinal axis of the microactuator. With such an arrangement, the resulting structure of the microactuator in the contracted state, as shown in FIG. 7b, will be a roll. In FIG. 7a the reinforcing structure on the outer microactuators are arranged with the longitudinal axis of the reinforcing elements in an angle of about 45 degrees in relation to the longitudinal axis of the microactuators. This results in the spiral configurations shown in FIG. 7b.

Figure 8A:
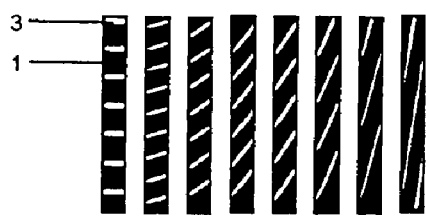
FIG. 8a–b shows a microactuator according to an embodiment of the invention seen from the top in an expanded state and in a contracted state.
Figure 8B:
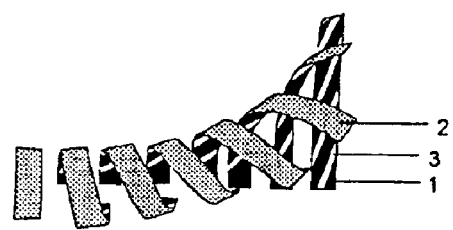

In FIG. 8a–b the group of microactuators consists of eight microactuators arranged in parallel. The reinforcing structure 3 is distributed so that the angle between the longitudinal axis of the reinforcing elements and the longitudinal axis of the microactuators changes from one actuator to the next. The angle is decreasing from left to right in FIG. 8a. In the left figure the angle is 90 degrees (perpendicular) and in the far right it is about 20 degrees in relation to the longitudinal axis of the microactuator. This results in a configuration in the contracted state as shown in FIG. 8b.

Figure 9A:
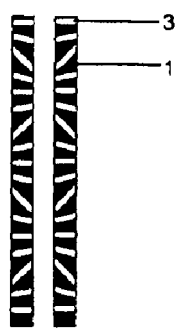
FIG. 9a–b shows a microactuator according to an embodiment of the invention seen from the top in an expanded state and in a contracted state.
Figure 9B:
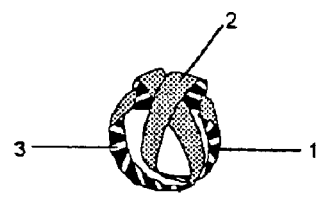

FIG. 9a–b illustrates that by combining elements with different arrangements of the reinforcing structure 3 on the microactuator, complex movements can be made. FIG. 9a–b shows a group of microctuators consisting of two microactuators arranged in parallel. Here, the reinforcing elements are arranged in different angles in relation to the longitudinal axis of the microactuator. In FIG. 9b the resulting contracted configuration is shown. The microactuators in FIG. 9b exhibit in their contracted state a knot shape.

The examples given above are merely given to indicate ways of carrying out the invention and they do not limit the invention. The shown embodiments can be combined in different ways according to the invention.

For instance can the embodiments of FIG. 1 and FIG. 2 be combined with each other, creating an embodiment with a reinforcing structure arranged on the outside of the volume changing layer and a reinforcing structure arranged inside the volume changing layer. In the same manner all the other embodiments shown can be combined with each other to create a stronger reinforcing structure if so needed. Any of the embodiments shown in the figures can also be combined with a reinforcing structure arranged in the form of an oriented film. In accordance with the invention more than two ways of constructing the reinforcing structure as described above can be combined together.

All the examples given of materials suitable for the respective layers and structures are possible to combine with each other. For instance can the volume changing layer be of polypyrrole, while the carrier substrate layer is of metal and the reinforcing structure is of polyurethane. Or the volume changing layer may be of polythiophene while the carrier substrate layer is of a polymer and the reinforcing structure is of a metal. And so on. The reinforcing structure may also be included in the carrier substrate layer and not made up of a separate material.

What is claimed is:

1. A microactuator comprising:
   (1) a volume changing layer,
   (2) a carrier substrate layer carrying the volume changing layer, and
   (3) a reinforcing structure having an unevenly distributed bending stiffness,
   wherein the reinforcing structure is spread over any of the volume changing layer and the carrier substrate layer to control the movement of the microactuator, and
   the volume changing layer is a conducting polymer.

2. The microactuator of claim 1, wherein the reinforcing structure is made with a different material than the volume changing layer and the carrier substrate layer.

3. The microactuator of claim 2, wherein the reinforcing structure is arranged on either side of the volume changing layer or the carrier substrate layer.

4. The microactuator of claim 2, wherein the reinforcing structure is arranged in the volume changing layer or in the carrier substrate layer.

5. The microactuator of claim 1, wherein the reinforcing structure is a part of the carrier substrate layer.

6. The microactuator of claim 1, wherein the reinforcing structure is arranged in the form of elongated elements.

7. The microactuator of claim 6, wherein the elongated elements are arranged transversely in relation to the direction of movement of the microactuator.

8. The microactuator of claim 5, wherein the reinforcing structure is arranged in the form of added thickness to parts of the carrier substrate layer on either or both sides of said carrier substrate layer.

9. The microactuator of claim 2, wherein the reinforcing structure is arranged as a layer with varying thickness.

10. The microactuator of claim 1, wherein the reinforcing structure comprises an oriented film.

11. The microactuator of claim 1, wherein the reinforcing structure is a polymer, including an epoxy or a polurethane, or a copolymer or a substituted polymer thereof, or a metal, including gold, platinum, titanium, stainless steel, or a nickel-titanium alloy.

12. The microactuator of claim 1, wherein the volume changing layer is a conducting polymer chosen from pyrrole, aniline, thiophene, para-phenylene, vinylene, or a phenylene polymer or a copolymer thereof, or a substituted form of different monomers.

13. The microactuator of claim 1, wherein the carrier substrate layer is a polymer, including an epoxy or a polurethane polymer, or a copolymer or substituted polymer thereof, or a metal, including gold, platinum, titanium, stainless steel, or a nickel-titanium alloy.

14. The microactuator of claim 1, wherein the microactuator has a lateral dimension in the centimetre to micrometre scale and a thickness in the millimetre to nanometre scale.

* * * * *